US006917045B2

(12) United States Patent
Hashimoto et al.

(10) Patent No.: US 6,917,045 B2
(45) Date of Patent: Jul. 12, 2005

(54) ELECTRON BEAM EXPOSURE APPARATUS, ELECTRON BEAM EXPOSURE APPARATUS CALIBRATION METHOD, AND SEMICONDUCTOR ELEMENT MANUFACTURING METHOD

(75) Inventors: Shin-ichi Hashimoto, Tokyo (JP); Haruo Yoda, Tokyo (JP); Masato Muraki, Tokyo (JP)

(73) Assignees: Advantest Corporation, Tokyo (JP); Hitachi Ltd., Tokyo (JP); Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 10/672,435

(22) Filed: Sep. 26, 2003

(65) Prior Publication Data

US 2004/0061065 A1 Apr. 1, 2004

(30) Foreign Application Priority Data

Sep. 27, 2002 (JP) .................................... 2002-284255

(51) Int. Cl.[7] .............................................. H01J 37/00
(52) U.S. Cl. .................... 250/492.1; 250/396; 250/398; 716/21
(58) Field of Search .............................. 250/492.1, 396, 250/398; 716/21

*Primary Examiner*—Nikita Wells
*Assistant Examiner*—Zia R. Hashmi
(74) *Attorney, Agent, or Firm*—Muramatsu & Associates (57) ABSTRACT

An electron beam exposure apparatus for controlling deflection timing of an electron beam with high precision, including: a blanking-electrode array having a deflecting electrode for deflecting an electron beam; a deflection timing control section for outputting the control signal for controlling the blanking-electrode array; a load circuit, of which the impedance is the same as that of the blanking-electrode array, where the wire length between the deflection timing control section and the load circuit is shorter than the wire length between the deflection timing control section and the deflecting electrode of the blanking-electrode array; and a switching section, connecting with the deflection timing control section, the blanking-electrode array, and the load circuit, for switching the destination of the control signal output from the deflection timing control section between the blanking-electrode array and the load circuit.

12 Claims, 6 Drawing Sheets

ELECTRON BEAM EXPOSURE APPARATUS, ELECTRON BEAM EXPOSURE APPARATUS CALIBRATION METHOD, AND SEMICONDUCTOR ELEMENT MANUFACTURING METHOD

BACKGROUND OF THE INVENTION

This patent application claims priority on a Japanese patent application No. 2002-284255 filed on Sep. 27, 2002, the contents of which are incorporated herein by reference.

1. Field of the Invention

The present invention relates to an electron beam exposure apparatus, an electron beam exposure apparatus calibration method, and a semiconductor element manufacturing method. More particularly, the present invention relates to an electron beam exposure apparatus for controlling deflection timing of an electron beam with high precision.

2. Description of Related Art

In an electron beam exposure apparatus for exposing a wafer by an electron beam, it is necessary to control deflection timing of the electron beam with high precision. For that purpose, it is necessary for the control section, which controls the deflecting section, to calibrate timing of control signal for controlling a deflecting section with high precision. When the control section calibrates the timing of the control signal and while the deflecting section is connected to the control section, it is difficult to detect the timing of the control signal correctly because a reflected signal reflected from the deflecting section is mixed with the control signal which is to be calibrated. Therefore conventionally, when the control section for controlling the electron beam deflecting section calibrates the timing of the control signal, the control section and the deflecting section are disconnected with each other to reduce the influence of the reflection or the like.

However, since impedance of the circuit driven by the control signal, when the deflecting section and the control section are disconnected, is different from impedance when it is connected with the deflecting section, rise time and fall time of the control signal is different from that of the actual exposure, and it has been impossible to calibrate the timing of the control signal with high precision, including rise time and fall time which affect the exposure processing.

SUMMARY OF THE INVENTION

Therefore, it is an object of the present invention to provide an electron beam exposure apparatus, an electron beam exposure apparatus calibration method, and a semiconductor element manufacturing method which can solve the foregoing problem. The above and other objects can be achieved by combinations described in the independent claims. The dependent claims define further advantageous and exemplary combinations of the present invention.

According to the first aspect of the present invention, there is provided an electron beam exposure apparatus for exposing a wafer by an electron beam. The electron beam exposure apparatus includes: a deflecting section including a deflecting electrode for deflecting the electron beam; a control section for outputting a control signal for controlling the deflecting section; a load circuit having substantially the same impedance as that of the deflecting section; and a switching section for switching a destination of the control signal between the deflecting section and the load circuit. A wire length between the control section and the load circuit is shorter than a wire length between the control section and the deflecting electrode.

The control section may synchronize timing at which the control section activates the control signal with timing at which the deflecting section is to deflect the electron beam, the control signal being supplied to the load circuit by the switching section.

The control section may adjust timing of exposing the wafer by the electron beam by synchronizing the timing of activating the control signal with the timing at which the deflecting section is to deflect the electron beam.

The control section may adjust timing of blocking the electron beam being irradiated on the wafer by synchronizing the timing of activating the control signal with the timing at which the deflecting section is to deflect the electron beam.

The control section may adjust the timing of irradiating the electron beam on the wafer by synchronizing timing of deactivating the control signal with timing at which the deflecting section is to stop the deflection of the electron beam.

The electron beam exposure apparatus may further include a temperature detector for detecting temperature of the control section. The control section may supply the control signal to the load circuit and synchronize the timing of activating the control signal with the timing at which the deflecting section is to deflect the electron beam when a temperature change detected by the temperature detector is more than a predetermined value.

The control section may supply the control signal to the load circuit and synchronize the timing of activating the control signal with the timing at which the deflecting section is to deflect the electron beam in a predetermined time interval.

The control section may supply the control signal to the load circuit and synchronize the timing of activating the control signal with the timing at which the deflecting section is to deflect the electron beam during startup of the electron beam exposure apparatus.

The control section may include: a driver for activating the control signal; and a comparing section connecting with the driver for comparing electric potential of the control signal activated by the driver with predetermined reference electric potential.

According to the second aspect of the present invention, there is provided a calibration method for calibrating an electron beam exposure apparatus including a deflecting section having a deflecting electrode for deflecting an electron beam, and exposing a wafer by the electron beam. The method including steps of: supplying a control signal for controlling the deflecting section to a load circuit; and synchronizing timing of activating the control signal with timing at which the deflecting section is to deflect the electron beam. The load circuit has substantially the same impedance as that of the deflecting section, and a wire length between the control section, which controls the deflecting section, and the load circuit, is shorter than a wire length between the control section and the deflecting electrode.

The calibration method may further include a step of adjusting impedance of the load circuit with that of the deflecting section when at least one of the parts of the deflecting section is replaced.

According to the third aspect of the present invention, there is provided a semiconductor element manufacturing method for exposing a pattern on a wafer by an electron beam, and manufacturing a semiconductor element using an electron beam exposure apparatus including a deflecting section having a deflecting electrode for deflecting the electron beam. The semiconductor element manufacturing method includes steps of: supplying a control signal for controlling the deflecting section to a load circuit; synchronizing timing of activating the control signal with timing at which the deflecting section is to deflect the electron beam by adjusting the timing of activating the control signal; and supplying the control signal, of which the timing of activation is adjusted, to the deflecting section and exposing the wafer. The load circuit has substantially the same impedance as that of the deflecting section, and a wire length between the control section, which controls the deflecting section, and the load circuit is shorter than a wire length between the control section and the deflecting electrode, and the deflecting section switches whether the electron beam is to be deflected or not according to the control signal in the wafer exposing step.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
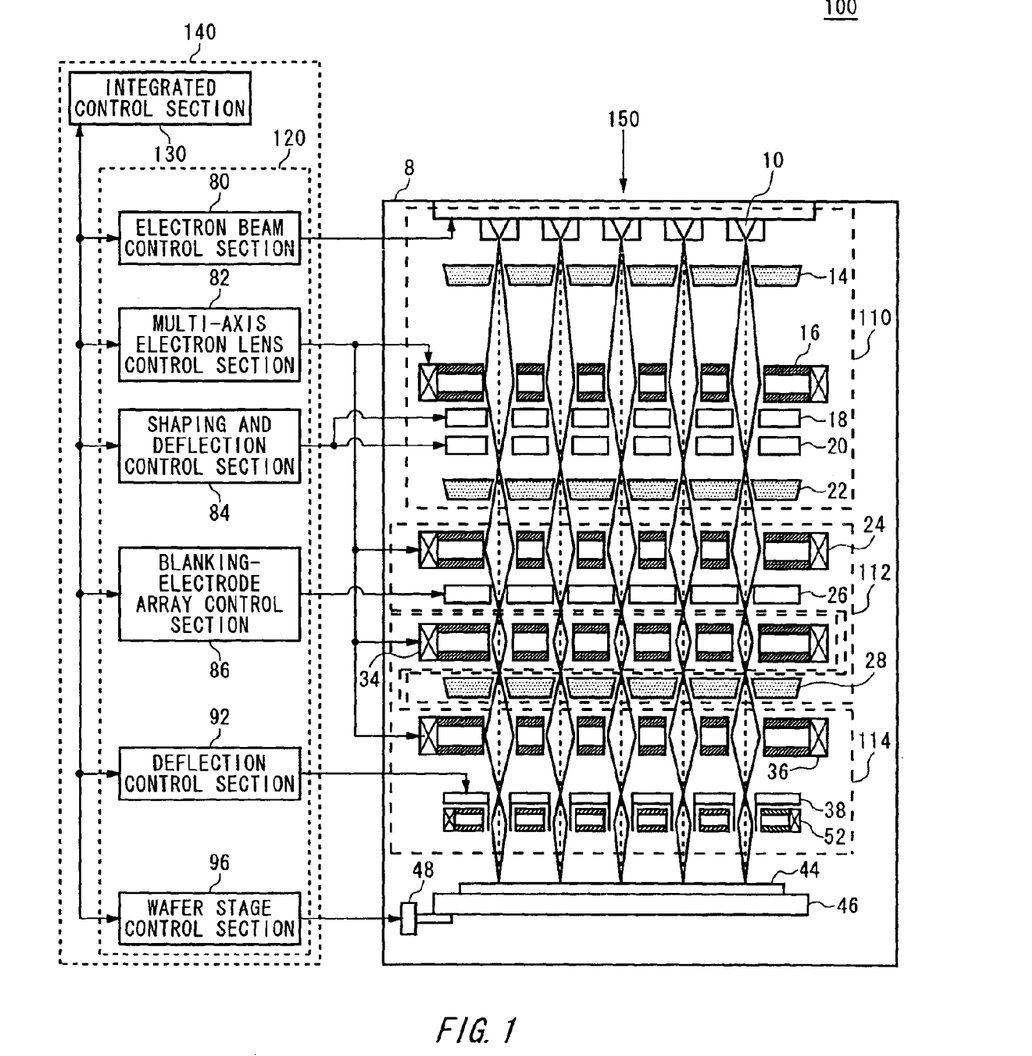
FIG. 1 is a schematic view showing a configuration of an electron beam exposure apparatus according to an embodiment of the present invention.

FIG. 1 is a schematic view showing a configuration of an electron beam exposure apparatus 100 according to an embodiment of the present invention. The electron beam exposure apparatus 100 includes an exposure section 150 for performing a predetermined exposure processing on a wafer 44 by an electron beam, and a control system 140 for controlling an operation of each component of the exposure section 150.

The exposure section 150 includes an electron optics system, which includes: electron beam shaping means 110 for generating a plurality of electron beams in a chamber 8 and shaping cross-sectional shapes of the electron beams into desired shapes; irradiation status switching means 112 for switching whether the plurality of electron beams are to be exposed on the wafer 44, respectively; and a wafer projection system 114 for adjusting direction and size of an image of a pattern which is to be exposed on the wafer 44. Moreover, the exposure section 150 includes a stage system, which includes: a wafer stage 46 on which the wafer 44 is placed, where the patterns are to be exposed on the wafer 44; and a wafer stage drive section 48 for driving the wafer stage 46.

The electron beam shaping means 110 includes: an electron beam generating section 10 for generating the plurality of electron beams; a first electron beam shaping section 14 and a second electron beam shaping section 22 including a plurality of apertures for shaping the cross-sectional shapes of the discharged electron beams by allowing the electron beams to pass through the apertures; a first multi-axis electron lens 16 for focusing the plurality of electron beams independently and adjusting the focal points of the plurality of electron beams; and a first shaping projection and deflection section 18 and a second shaping projection and deflection section 20 for independently deflecting the plurality of electron beams which have passed through the first electron beam shaping section 14. The second electron beam shaping section 22 includes a substrate, a plurality of shaping apertures provided in the substrate, and a substrate heating section for heating the substrate.

The irradiation status switching means 112 includes a second multi-axis electron lens 24 for focusing the plurality of electron beams independently and adjusting the focal points of the plurality of electron beams, a blanking-electrode array 26, which is an example of the deflecting section of the present invention, for independently switching whether or not each of the electron beams is to be irradiated on the wafer 44 by deflecting each of the plurality of electron beams independently, and an electron beam blocking member 28, which includes a plurality of apertures through which the electron beams pass, for blocking the electron beam deflected by the blanking-electrode array 26. In another example, the blanking-electrode array 26 is a blanking aperture array device.

The wafer projection system 114 includes a third multi-axis electron lens 34 for focusing the plurality of electron beams independently and decreasing irradiated cross-sectional area of the electron beams, a fourth multi-axis electron lens 36 for focusing each of the plurality of electron beams independently and adjusting a focal point of each of the electron beams, a projection and deflection section 38 for independently deflecting each of the plurality of electron beams into a desired location on the wafer 44, and a fifth multi-axis electron lens 52, which functions as an object lens for the wafer 44, for focusing each of the plurality of electron beams independently.

The control system 140 includes an individual control section 120 and an integrated control section 130. The individual control section 120 includes an electron beam control section 80, a multi-axis electron lens control section 82, a shaping and deflection control section 84, a blanking-electrode array control section 86, a projection and deflection control section 92, and a wafer stage control section 96. For example, the integrated control section 130 is a workstation for controlling each of the control sections of the individual control section 120.

The electron beam control section 80 controls the electron beam generating section 10. The multi-axis electron lens control section 82 controls electric current supplied to the first multi-axis electron lens 16, the second multi-axis electron lens 24, the third multi-axis electron lens 34, the fourth multi-axis electron lens 36, and the fifth multi-axis electron lens 52. The shaping and deflection control section 84 controls the first shaping deflector 18 and the second shaping deflector 20. The blanking-electrode array control section 86 outputs the control signal for controlling the blanking-electrode array 26. The projection and deflection control section 92 controls voltage applied to the deflection electrodes of a plurality of deflectors of the projection and deflection section 38. The wafer stage control section 96 controls the wafer stage driver 48 so that the wafer stage 46 is caused to move to a predetermined location.

Operation of the electron beam exposure apparatus 100 according to the present embodiment will be explained hereinafter. First, the electron beam generating section 10 generates the plurality of electron beams. The first electron beam shaping section 14 shapes the plurality of electron beams, which are generated by the electron beam generating section 10 and irradiated on the first electron beam shaping section 14, by allowing them to pass through a plurality of apertures of the first electron beam shaping section 14. In another example, a plurality of electron beams are generated by further including means for dividing an electron beam generated by the electron beam generating section 10 into a plurality of electron beams.

The first multi-axis electron lens 16 independently collects each of the plurality of electron beams, which is shaped into rectangular shape, and independently adjusts focal point of each of the electron beams to the second electron beam shaping section 22. The first shaping deflector 18 independently deflects the plurality of electron beams, which are shaped into rectangular shapes by the first electron beam shaping section 14, so that the plurality of electron beams are irradiated on desired positions on the second electron beam shaping section 22.

The second shaping deflector 20 deflects the plurality of electron beams deflected by the first shaping deflector 18 in substantially perpendicular direction to the second electron beam shaping section 22, and allows them to be irradiated on the second electron beam shaping section 22. Then, the second electron beam shaping section 22, which includes a plurality of apertures having rectangular shapes, further shapes the plurality of electron beams, which have rectangular cross-sectional shapes and are irradiated on the second electron beam shaping section 22, into the electron beams having desired cross-sectional shapes so that the electron beams are irradiated on the wafer 44. At this time, in the second electron beam shaping section 22, the substrate heating section heats the substrate, in which shaping apertures are provided according to the cross-sectional shapes of the electron beams which are to be irradiated on the wafer 44, and maintains the shape of the substrate.

The second multi-axis electron lens 24 independently collects the plurality of electron beams, and independently adjusts the focal point of each of the electron beams to the blanking-electrode array 26. Then, the plurality of electron beams, of which the focal points are adjusted by the second multi-axis electron lens 24, pass through a plurality of apertures of the blanking-electrode array 26, respectively.

The blanking-electrode array control section 86 outputs the control signal for controlling the deflecting electrodes provided in the vicinity of each of the apertures of the blanking-electrode array 26. The blanking-electrode array 26 switches whether or not each of the electron beams are to be irradiated on the wafer 44 based on the control signal input from the blanking-electrode array control section 86.

The electron beam which is deflected by the blanking-electrode array 26 is blocked by the electron beam blocking member 28. The electron beam which is not deflected by the blanking-electrode array 26 passes through the third multi-axis electron lens 34. Then, the third multi-axis electron lens 34 reduces the diameter of the electron beam which passes through the third multi-axis electron lens 34. The reduced electron beam passes through an aperture of the electron beam blocking member 28. Moreover, the electron beam which has passed through the electron beam blocking member 28 enters the fourth multi-axis electron lens 36. Then, the fourth multi-axis electron lens 36 independently collects each of the entered electron beams, and respectively adjusts the focal point of each of the electron beams to the projection and deflection section 38. The electron beam, of which the focal point is adjusted by the fourth multi-axis electron lens 36, enters the projection and deflection section 38.

The projection and deflection control section 92 controls a plurality of deflectors of the projection and deflection section 38, and independently deflects each of the electron beams, which enters the projection and deflection section 38, into the position where it is to be irradiated on the wafer 44. The fifth multi-axis electron lens 52 adjusts the focal point of each of the electron beams to the wafer 44 which passes through the fifth multi-axis electron lens 52. Then, each of the electron beams, having the cross-sectional shape which is to be irradiated on the wafer 44, is irradiated on a desired position of the wafer 44, where it is to be irradiated.

During the exposure processing, it is preferable that the wafer stage drive section 48 continuously moves the wafer stage 46 to a predetermined direction based on an instruction from the wafer stage control section 96. Then, according to the movement of the wafer 44, the electron beam shaping means 110 shapes the cross-sectional shape of the electron beam into the shape which is to be irradiated on the wafer 44, and the blanking-electrode array control section 86 switches whether to irradiate the electron beam on the wafer 44 or not with high precision. Then, a desired circuit pattern is exposed on the wafer 44 by the projection and deflection section 38 deflecting each of the electron beams onto the position of the wafer 44 at which the electron beam is to be irradiated.

According to the electron beam exposure apparatus 100 of the present embodiment, since the timing of the control signal for controlling the blanking-electrode array 26 is calibrated with high precision by the blanking-electrode array control section 86, and since the calibrated blanking-electrode array control section 86 controls the blanking-electrode array 26 to switch whether to irradiate the electron beam on the wafer 44 according to the highly precise timing, a highly accurate pattern is exposed on the wafer 44.

In another example, the deflecting section of the present invention is any of the first shaping deflecting section 18, the second shaping deflecting section 20, and the projection and deflection section 38 in the present embodiment. In case that the deflecting section of the present invention is the first shaping deflecting section 18 and/or the second shaping deflecting section 20, the control section of the present invention will be the shaping and deflection control section 84. Moreover, in case that the deflecting section of the present invention is the projection and deflection section 38, the control section of the present invention will be the projection deflection control section 92.

Figure 2:
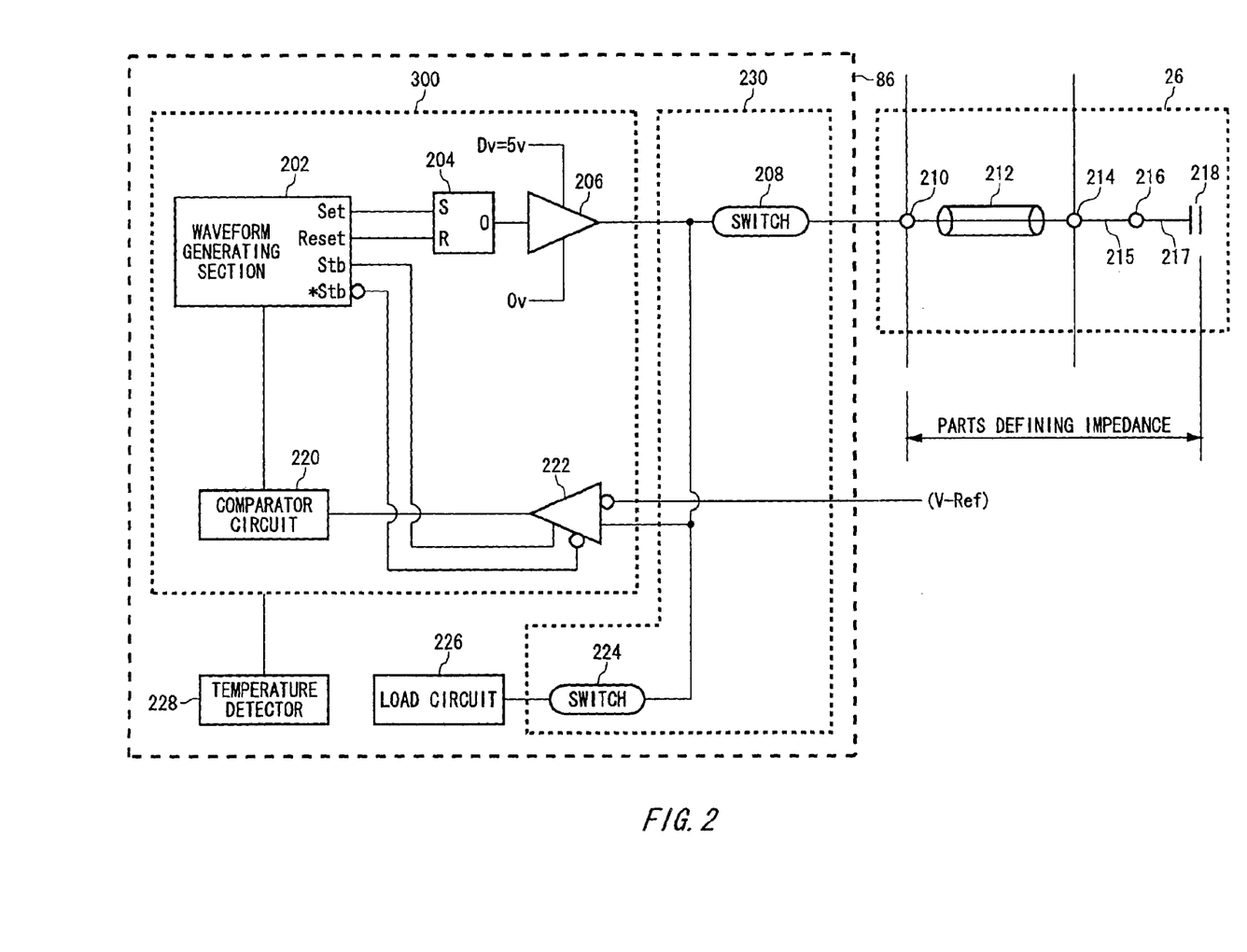
FIG. 2 is a circuit diagram of a blanking-electrode array control section and a blanking-electrode array.

FIG. 2 is a circuit diagram of the blanking-electrode array control section 86 and the blanking-electrode array 26 of the electron beam exposure apparatus 100. The blanking-electrode array control section 86 includes: a deflection timing control section 300 for outputting the control signal for controlling the blanking-electrode array 26; a load circuit 226, of which the impedance is the same as that of the blanking-electrode array 26, where the wire length between the deflection timing control section 300 and the load circuit 226 is shorter than the wire length between the deflection timing control section 300 and the deflecting electrode 218 of the blanking-electrode array 26; and a switching section 230, connecting with the deflection timing control section 300, the blanking-electrode array 26, and the load circuit 226, for switching the destination of the control signal output from the deflection timing control section 300 between the blanking-electrode array 26 and the load circuit 226. Alternatively, the blanking-electrode array control section 86 further includes a temperature detector 228, which connects with the deflection timing control section 300, for detecting temperature of the deflection timing control section 300. The deflection timing control section 300 is an example of the control section of the present invention.

The blanking-electrode array 26 includes: a deflecting electrode 218 for deflecting the electron beam; a connector 210 for connecting the blanking-electrode array 26 with the blanking-electrode array control section 86; a cabling 212 connecting with the connector 210; a connector 214 connecting with the cabling 212; a substrate wiring 215 connecting with the connector 214; a pogo contact 216 connecting with the substrate wiring 215; and a device internal wiring 217 for connecting the pogo contact 216 and the deflecting electrode 218.

The deflection timing control section 300 includes: a driver 206 connecting with the switching section 230 for outputting a control signal; a waveform generating section 202 for outputting a set signal to raise the electric potential of the output of the driver 206 and a reset signal to lower the electric potential of the output of the driver 206; a set/reset latch 204 provided between the waveform generating section 202 and the driver 206 for causing the output of the driver 206 to rise or fall according to the set signal or the reset signal output from the waveform generating section 202; a comparator 222 connecting with the driver 206 and the waveform generating section 202 for outputting a comparison result between the electric potential of the control signal activated by the driver 206 and reference potential; and a comparator circuit 220 connecting with the comparator 222 and the waveform generating section 202 for comparing the signal from the comparator 222 with a predetermined signal. The comparator 222 is an example of the comparing section of the present invention.

The switching section 230 includes a switch 208 provided between the deflection timing control section 300 and the blanking-electrode array 26, and a switch 224 provided between the deflection timing control section 300 and the load circuit 226. The switching section 230 connects the deflection timing control section 300 to either the blanking-electrode array 26 or the load circuit 226 using the switch 208 and the switch 224.

Since a wire length between the deflection timing control section 300 and the load circuit 226 is shorter than a wire length between the deflection timing control section 300 and the blanking-electrode array 26, disturbance of the signal reflected from the load circuit 226 attenuates more than disturbance of the signal reflected from the blanking-electrode array 26. Moreover, since one end of the load circuit 226 is terminated, reflection of the input signal at the load circuit 226 is reduced.

According to the blanking-electrode array control section 86 and the blanking-electrode array 26 which are configured as described above, the deflection timing control section 300 disconnects the contact between the deflection timing control section 300 and the blanking-electrode array 26 using the switching section 230, supplies the control signal to the load circuit 226 while the deflection timing control section 300 connecting with the load circuit 226, and calibrates the timing of the control signal. Specifically, the deflection timing control section 300 synchronizes the timing at which the electric potential in the circuit connected to the output of the driver 206 rises to an electric potential for the activation of the control signal (to be referred to as activation of control signal hereinafter), with the timing at which the blanking-electrode array 26 deflects the electron beam. Moreover, the deflection timing control section 300 synchronizes the timing when the voltage in the circuit connected to the output of the driver 206 falls to a voltage for deactivation of the control signal (to be referred to as deactivation of control signal hereinafter), with the timing at which the blanking-electrode array 26 stops the deflection of the electron beam.

In this case, since the deflection timing control section 300 and the blanking-electrode array 26 are disconnected from each other, the timing of the control signal is correctly detectable without mixing the reflected signal from the blanking-electrode array 26 with the control signal which is to be calibrated. Moreover, since the load circuit 226 connects with the deflection timing control section 300, the impedance of the circuit driven by the control signal is substantially the same as the impedance of the blanking-electrode array 26. Consequently, the timing of the activation/deactivation of the control signal is substantially the same as the timing to start/stop the actual exposure. Therefore, the deflection timing control section 300 detects and calibrates the activation/deactivation timing of the control signal with high precision in substantially the same condition as the start/stop timing of the actual exposure.

Figure 3:
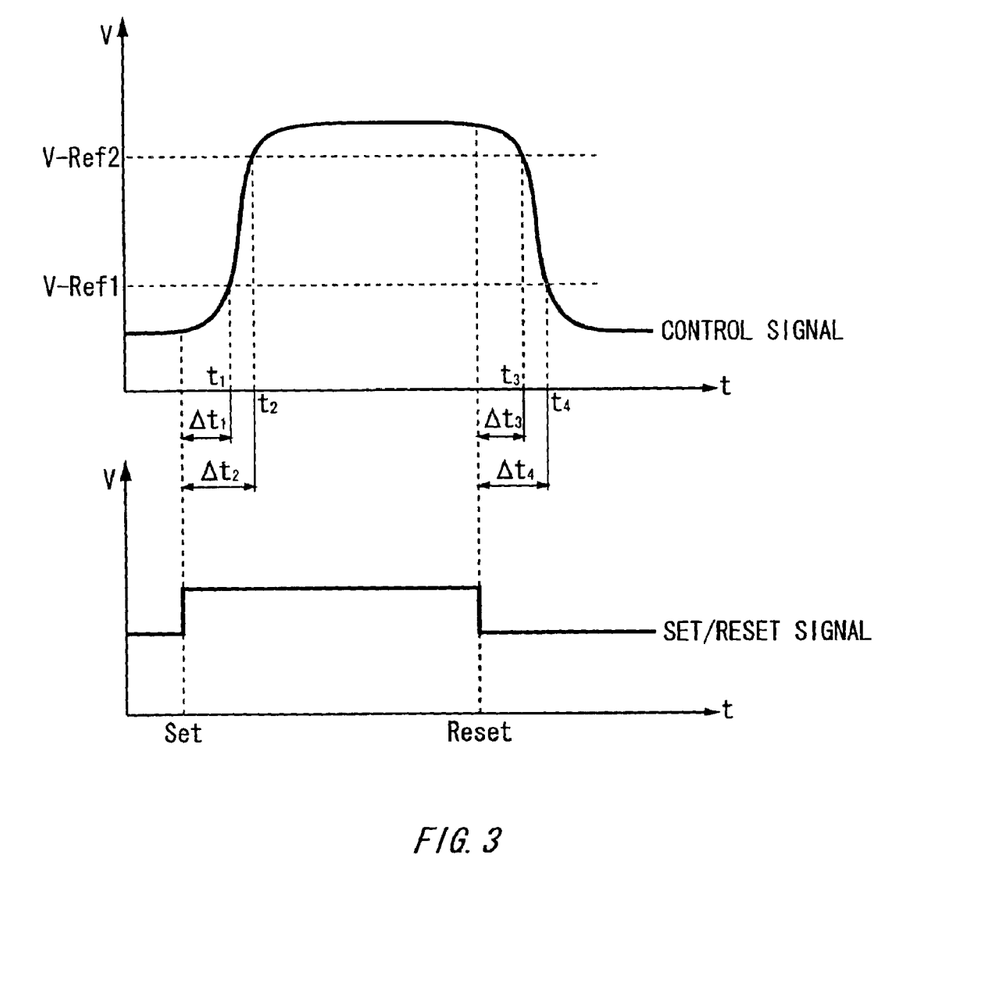
FIG. 3 is a drawing showing relation between a set/reset signal and a control signal.

FIG. 3 is a drawing showing relation between the set/reset signal output from the set/reset latch 204 and the control signal output from the driver 206 outputs according to the set/reset signal when the deflection timing control section 300 connects the load circuit 226 with the deflection timing control section 300 itself using the switching section 230.

In FIG. 3, an electric potential to activate the control signal is defined as V-Ref2, and an electric potential to deactivate the control signal is defined as V-Ref1. Then, a delay time from a timing (Set) at which the set signal of the set/reset signal is input to the driver, to a timing (t1) at which the control signal has been raised to V-Ref1, is defined as $\Delta t1$, and a delay time from the timing (Set) to a timing (t2) at which the control signal has been raised to V-Ref2, is defined as $\Delta t2$. Moreover, a delay time from a timing (Reset) at which the reset signal of the set/reset signal is input to the driver, to a timing (t3) at which the control signal has been lowered to V-Ref2, is defined as $\Delta t3$, and a delay time from the timing (Reset) to a timing (t4) at which the control signal has been lowered to V-Ref1, is defined as $\Delta t4$. The delay times $\Delta t1$, $\Delta t2$, $\Delta t3$, and $\Delta t4$ vary according to the impedance of the load circuit 226 explained in relation to FIG. 2. For example, if the impedance of the load circuit 226 becomes high, all of the delay times $\Delta t1$, $\Delta t2$, $\Delta t3$, and $\Delta t4$ become long. The blanking-electrode array control section 86 according to the present embodiment calibrates the delay times $\Delta t1$, $\Delta t2$, $\Delta t3$, and $\Delta t4$ with high precision.

In addition, even if the timing of activation and deactivation of the control signal is calibrated with high precision, since property of the blanking-electrode array 26 or the deflection timing control section 300 may change after the calibration, there may be a difference between the activation/deactivation timing of the control signal and the timing of starting/stopping the deflection of the electron beam. For example, such a difference occurs when the impedance of the blanking-electrode array 26 changes due to parts replacement, or when the property of the deflection timing control section 300 changes with temperature rises. Therefore, in case that such a difference may occur, the deflection timing control section 300 calibrates the activation/deactivation timing of the control signal once again.

Figure 4:
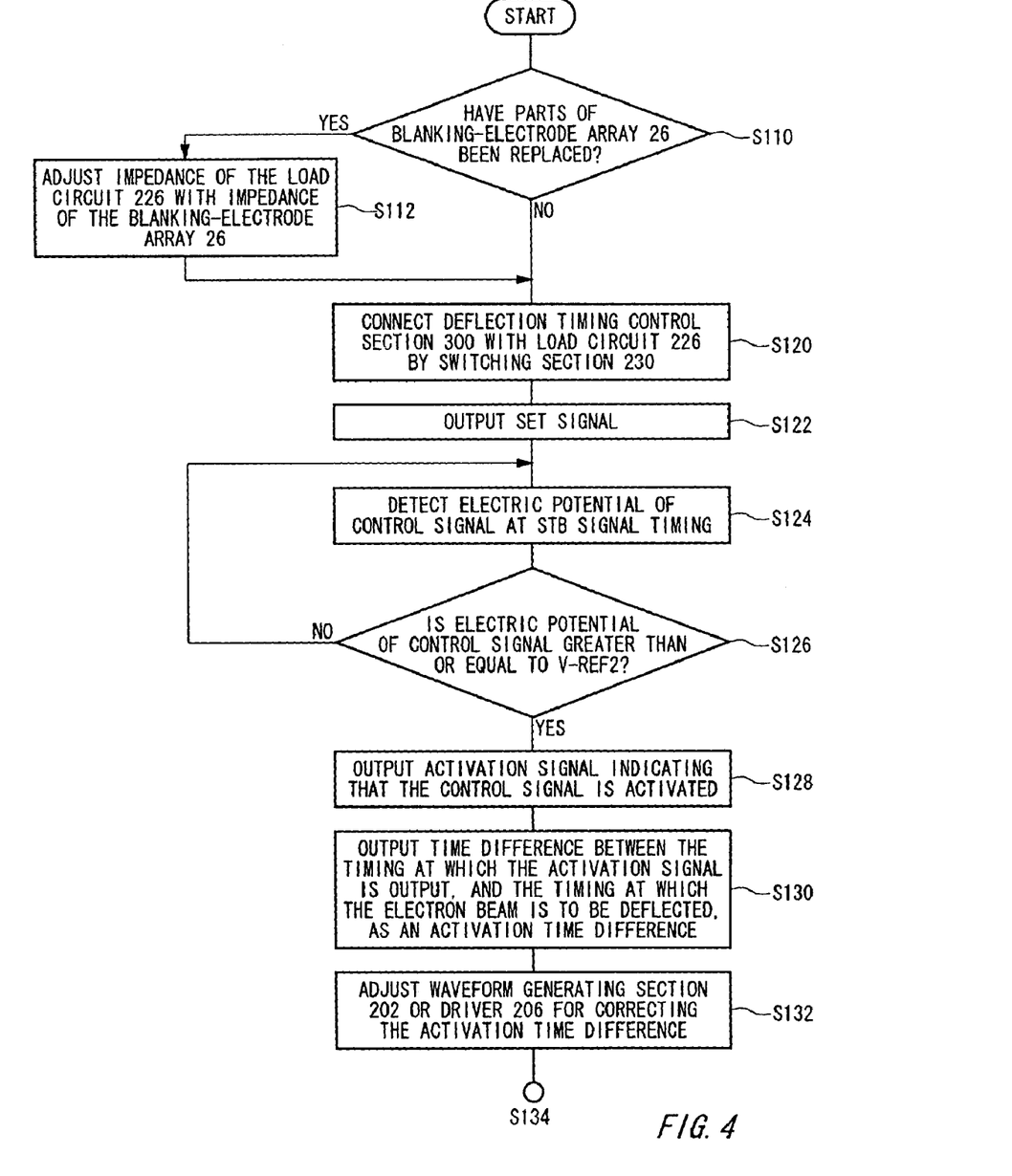
FIG. 4 is a flow chart showing an operation of a deflection timing control section calibrating timing of the control signal.
Figure 5:
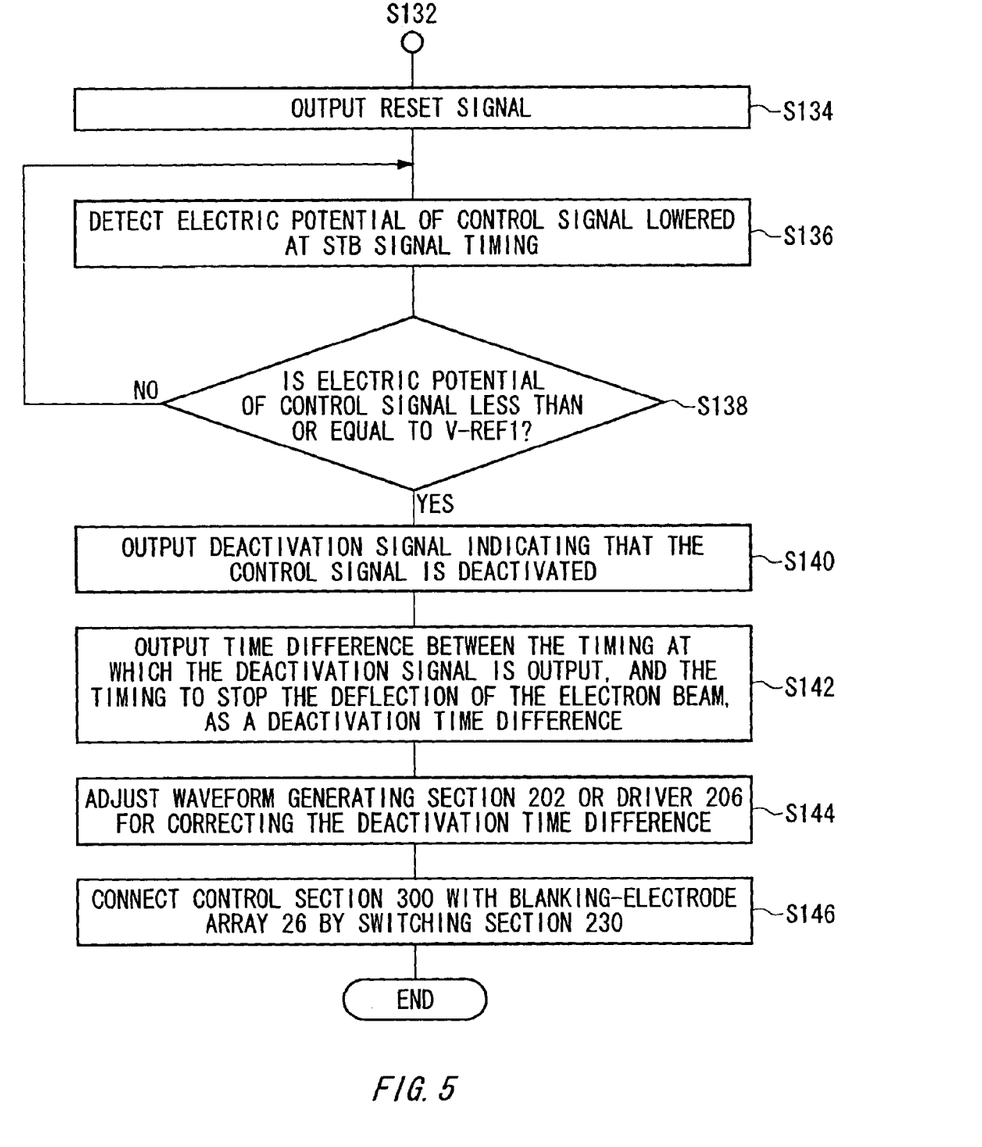
FIG. 5 is a flow chart showing an operation of the deflection timing control section calibrating the timing of the control signal.

FIGS. 4 and 5 are a flow charts showing operation of the deflection timing control section 300 calibrating the activation/deactivation timing of the control signal. In these flow charts, the activation timing of the control signal will be calibrated in steps from S112 to S132 in FIG. 4, and the deactivation timing of the control signal will be calibrated in steps from S134 to S144 in FIG. 5.

First, it is judged whether the cable 212, the connectors 210 and 214, the pogo contact 216, etc., out of all parts of the blanking-electrode array 26, have been replaced or not, where above-mentioned parts define the impedance of the blanking-electrode array 26 (S110). To judge whether the parts defining the impedance of the blanking-electrode array 26 have been replaced or not, a user establishes the record of the parts replacement and store it in the integrated control section 130, for example. Then, the blanking-electrode array control section 86 checks the integrated control section 130 to judge whether the parts have been replaced or not. Alternatively, the integrated control section 130 detects replacement, attachment and detachment of the parts by a switch, a sensor or the like. If it is judged that the parts have not been replaced in S110, it proceeds to S120. If it is judged that the parts have been replaced in S110, a user or an integrated control section 130 measures the impedance of the blanking-electrode array 26 and adjusts the impedance of the load circuit 226 with the measured impedance of the blanking-electrode array 26 (S112).

Next, the deflection timing control section 300 is disconnected from the blanking-electrode array 26 and connected to the load circuit 226 using the switching section 230 (S120).

Next, the waveform generating section 202 outputs the set signal to raise the electric potential of the output of the driver 206 (S122). The driver 206 raises the electric potential of the output to a predetermined driver voltage, e.g., 5 volts, based on the set/reset signal output from the set/reset latch 204 in response to the set signal. At this time, the comparator 222 detects the electric potential of the control signal raised by the driver 206 at a timing of a strobe (Stb) signal output from the waveform generating section 202 (S124), and judges whether the electric potential of the control signal is greater than or equal to V-Ref2 explained in FIG. 3 (S126).

If the electric potential of the control signal is less than V-Ref2 in S126, it returns to S124. If the electric potential of the control signal is greater than or equal to V-Ref2 in S126, the comparator 222 outputs the activation signal to the comparator circuit 220 indicating that the control signal is activated (S128).

Next, the comparator circuit 220 outputs time difference between the timing at which the activation signal is output, and the timing at which the blanking-electrode array 26 is to deflect the electron beam, to the waveform generating section 202 as an activation time difference (S130). Here, the timing at which the electron beam is to be deflected is a timing of a signal delayed for a predetermined period from the timing of the set signal, the set signal being output from the waveform generating section 202. For example, it is the timing of the signal delayed from the set signal timing for a predetermined delay period which is defined according to the configuration of the blanking-electrode array 26.

Next, the deflection timing control section 300 adjusts the waveform generating section 202 or the driver 206 for correcting the activation time difference (S132). Specifically, the deflection timing control section 300 adjusts the timing at which the waveform generating section 202 outputs the set signal for correcting the activation time difference in S132. For example, in case that the output timing of the activation signal is delayed from the timing at which the electron beam is to be deflected for T1, the activation time difference T1 is corrected by advancing the timing at which the waveform generating section 202 outputs the set signal for T1. Alternatively, the deflection timing control section 300 corrects the activation time difference by changing driver voltage of the driver 206. For example, if the driver voltage of the driver 206 is increased to more than 5 volts, which is the predetermined voltage according to the present embodiment, the activation timing of the control signal will advance, and if it is dropped to less than 5 volts, the activation timing of the control signal will delay.

Next, in FIG. 5, the waveform generating section 202 outputs the reset signal to lower the electric potential of the output of the driver 206 (S134). The output of the driver 206 falls according to the set/reset signal output from the set/reset latch 204 in response to the reset signal. At this time, the comparator 222 detects the electric potential of the control signal lowered by the driver 206 at a timing of a strobe (Stb) signal output from the waveform generating section 202 (S136), and judges whether the electric potential of the control signal is less than or equal to V-Ref1 explained in FIG. 3 (S138).

If the electric potential of the control signal is greater than V-Ref1 in S138, it returns to S136. If the electric potential of the control signal is less than or equal to V-Ref1 in S138, the comparator 222 outputs a deactivation signal to the comparator circuit 220 indicating that the control signal is deactivated (S140).

Next, the comparator circuit 220 outputs time difference between the timing at which the deactivation signal is output, and the timing at which the blanking-electrode array 26 is to stop the deflection of the electron beam, to the waveform generating section 202 as a deactivation time difference (S142). Here, the timing of stopping the deflection of the electron beam is a timing of a signal delayed for a predetermined period from the timing of the reset signal, the reset signal being output from the waveform generating section 202. For example, it is the timing of the signal delayed from the reset signal timing for a predetermined delay period which is defined according to the configuration of the blanking-electrode array 26.

Next, the deflection timing control section 300 adjusts the waveform generating section 202 or the driver 206 for correcting the deactivation time difference (S144). Specifically, the deflection timing control section 300 adjusts the timing at which the waveform generating section 202 outputs the reset signal for correcting the deactivation time difference in S144. For example, in case that the output timing of the deactivation signal is delayed from the timing of stopping the deflection of the electron beam for T2, the deactivation time difference T2 is corrected by advancing the timing at which the waveform generating section 202 outputs the reset signal for T2. Alternatively, the deflection timing control section 300 corrects the deactivation time difference by changing driver voltage of the driver 206. For example, if the driver voltage of the driver 206 is increased to more than 5 volts, which is the predetermined voltage according to the present embodiment, the deactivation timing of the control signal will advance, and if it is dropped to less than 5 volts, the deactivation timing of the control signal will delay.

Finally, the deflection timing control section 300 is disconnected from the load circuit 226 and connected to the blanking-electrode array 26 using the switching section 230 (S146) This is the end of the sequential flow.

According to the calibration method described above, the deflection timing control section 300 calibrates the timing of the control signal with high precision.

In another example, the deflection timing control section 300 outputs a predetermined signal to the blanking-electrode array 26, and measures the round-trip time for the signal to reach the blanking-electrode array 26 and reflect back for judging whether the parts, which define the impedance of the blanking-electrode array 26, have been replaced or not. When the measured reflection time is different from the reflection time which was measured last time, it is judged that the parts, which define the impedance of the blanking-electrode array 26, have been replaced.

When a cycle of the strobe signal in S124 becomes short, the timing at which the comparator 222 outputs the activation signal in S128 approaches the timing t2 explained in FIG. 3. When a cycle of the strobe signal in S136 becomes short, the timing at which the comparator 222 outputs the deactivation signal in S140 approaches the timing t4 explained in FIG. 3.

Alternatively, the comparator 222 outputs the delay time $\Delta t2$ explained in FIG. 3 to the comparator circuit 220 in S128. In this case, the comparator circuit 220 outputs time difference between the delay time $\Delta t2$ and a delay time $\Delta t2'$, which is predetermined according to the configuration of the blanking-electrode array 26, to the waveform generating section 202 as the activation time difference in S130. Alternatively, the comparator 222 outputs the delay time $\Delta t4$ explained in FIG. 3 to the comparator circuit 220 in S140. In this case, the comparator circuit 220 outputs time difference between the delay time $\Delta t4$ and a delay time $\Delta t4'$, which is predetermined according to the configuration of the blanking-electrode array 26, to the waveform generating section 202 as the deactivation time difference in S142.

The electron beam exposure apparatus 100 according to the present embodiment calibrates the timing of the control signal for controlling the blanking-electrode array 26 in the following cases described below.

First, when the temperature of the deflection timing control section 300 changes, the timing of the control signal may deviate from the timing when it was calibrated. Therefore, the deflection timing control section 300 according to the present embodiment calibrates the timing of the control signal in accordance with the steps from S110 to S146 in case that the temperature change detected by the temperature detector 228 explained in FIG. 2 is more than a predetermined value. Thereby, the electron beam exposure apparatus 100 compensates the deviation of the deflection timing of the electron beam resulting from the temperature change.

Moreover, the timing of the control signal may deviate from the timing when it was calibrated by change in properties of the parts of the deflection timing control section 300 with time. Therefore, the deflection timing control section 300 according to the present embodiment calibrates the timing of the control signal in accordance with the steps from S110 to S146 within a predetermined time interval. Thereby, the electron beam exposure apparatus 100 compensates the deviation of the deflection timing of the electron beam resulting from the change in properties of the deflection timing control section 300 with time.

Moreover, the output characteristic of the deflection timing control section 300 may change during startup of the electron beam exposure apparatus 100. Therefore, the deflection timing control section 300 according to the present embodiment calibrates the timing of the control signal in accordance with the steps from S110 to S146 during the startup of the electron beam exposure apparatus 100. Thereby, the electron beam exposure apparatus 100 compensates the deviation of the deflection timing of the electron beam resulting from the output characteristic change of the deflection timing control section 300 during the startup of the electron beam exposure apparatus 100.

Moreover, in case that the driver voltage of the driver 206 changes, the timing of the control signal may change. Therefore, the deflection timing control section 300 according to the present embodiment calibrates the timing of the control signal in accordance with the steps from S110 to S146 in case that the driver voltage of the driver 206 changes more than a predetermined value. Thereby, the electron beam exposure apparatus 100 compensates the deviation of the deflection timing of the electron beam resulting from the change of the driver voltage of the driver 206.

Alternatively, the comparator 222 outputs a signal indicating that the voltage of the control signal has been raised to V-Ref1 at the timing t1 explained in FIG. 3. The comparator circuit 220 is capable of measuring a rise time of the voltage when the control signal is activated by calculating the time difference between t1 and t2 (t2−t1). The deflection timing control section 300 adjusts the driver 206 to change the rise time based on the time difference between t1 and t2.

The comparator 222 outputs a signal indicating that the voltage of the control signal has been lowered to V-Ref2 at the timing t3 explained in FIG. 3. The comparator circuit 220 is capable of measuring a fall time of the voltage when the control signal is deactivated by calculating the time difference between t3 and t4 (t4−t3). The deflection timing control section 300 adjusts the driver 206 to change the fall time based on the time difference between t3 and t4.

Figure 6:
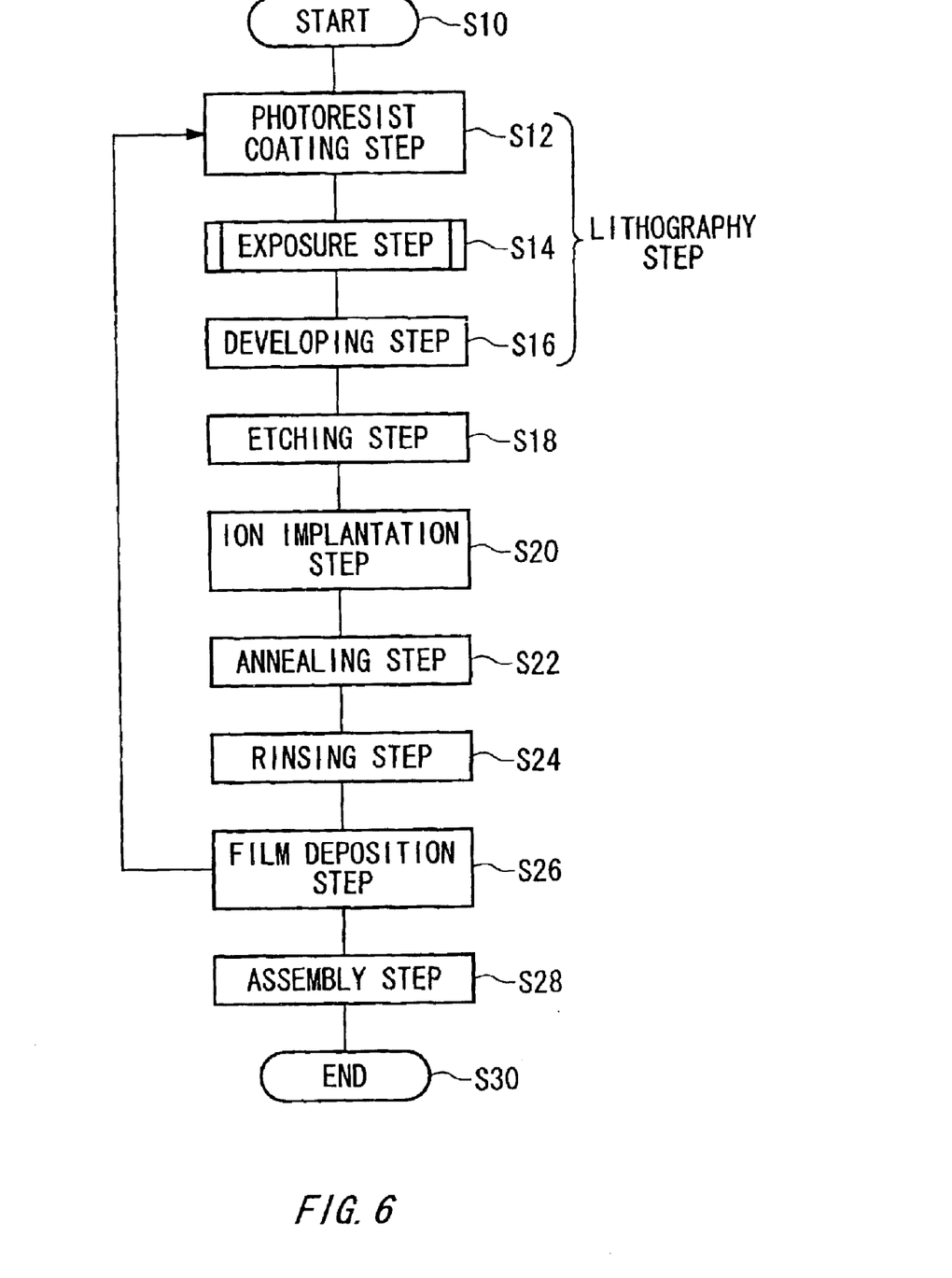
FIG. 6 is a flow chart of a semiconductor manufacturing process for manufacturing a semiconductor element from a wafer.

FIG. 6 is a flow chart of a semiconductor element manufacturing process of exposing the wafer 44 and manufacturing the semiconductor element by the electron beam exposure apparatus 100 according to the present embodiment.

This flow chart begins from S10. Upper surface of the wafer 44 is coated by photoresist in a photoresist coating step (S12). Then, the wafer 44, on which the photoresist has been coated, is placed on the wafer stage 46 of the electron beam exposure apparatus 100 shown in FIG. 1. In an exposure step, the deflection timing control section 300 calibrates the timing of activating and deactivating the control signal in accordance with the steps from S120 to S146 explained in FIGS. 4 and 5 before exposing the wafer 44. Then, the control signal, of which the activation and deactivation timing has been calibrated, is supplied to the blanking-electrode array 26, and the wafer 44 is exposed, where whether the electron beam is to be deflected or not is switched in accordance with the control signal (S14). The electron beam which is not deflected by the blanking-electrode array 26 is irradiated on the wafer, and the electron beam deflected by the blanking-electrode array 26 is blocked so as not to expose the wafer.

Next, in a developing step, the exposed wafer 44 is immersed in a developer to remove excessive resist and to develop the wafer 44. Then, in an etching step, silicon substrate, conductive film, or insulating film in the area, from which the photoresist on the wafer 44 has been removed, is etched by anisotropic etching using plasma (S18). Then, in an ion implantation step, impurities, such as boron and arsenic, are implanted into the wafer 44 to form semiconductor elements, such as transistors and diodes, (S20). Then, in an annealing step, the wafer 44 is annealed to activate the implanted impurities (S22). Then, in a rinsing step, the wafer 44 is rinsed with a chemical in order to remove the organic contamination and metallic contamination on the wafer 44 (S24). Then, in a film deposition step, the conductive film and the insulating film are deposited to form a wiring layer and an insulating layer between the wirings (S26). By combining and repeating the steps from the photoresist coating step (S12) to the film deposition step (S26), the semiconductor element with isolation area, device area, and wiring layer in the wafer 44, is manufactured. Then, in an assembly step, the wafer 44, in which the necessary circuits have been integrated, is diced and chips are assembled (S28). Then, the semiconductor element manufacturing process is completed at S30.

According to the manufacturing method of the semiconductor element described above, the irradiation timing of the electron beam is controllable with high precision, and the high density semiconductor element can be manufactured from the wafer on which the desired pattern is exposed with high precision.

As described above, according to the present invention, there is provided the electron beam exposure apparatus for exposing a desired pattern on the wafer with high precision by controlling the deflection timing of the electron beam with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electron beam exposure apparatus for exposing a wafer by an electron beam, comprising:
   a deflecting section including a deflecting electrode for deflecting the electron beam;
   a control section for outputting a control signal for controlling said deflecting section;
   a load circuit having substantially the same impedance as that of said deflecting section; and
   a switching section for switching a destination of the control signal between said deflecting section and said load circuit, wherein
   a wire length between said control section and said load circuit is shorter than a wire length between said control section and said deflecting electrode.

2. The electron beam exposure apparatus as claimed in claim 1, wherein said control section synchronizes timing at which said control section activates said control signal with timing at which said deflecting section is to deflect the electron beam, the control signal being supplied to said load circuit by said switching section.

3. The electron beam exposure apparatus as claimed in claim 2, wherein said control section adjusts timing of exposing the wafer by the electron beam by synchronizing the timing of activating the control signal with the timing at which said deflecting section is to deflect the electron beam.

4. The electron beam exposure apparatus as claimed in claim 2, wherein said control section adjusts timing of blocking the electron beam being irradiated on the wafer by synchronizing the timing of activating the control signal with the timing at which said deflecting section is to deflect the electron beam.

5. The electron beam exposure apparatus as claimed in claim 2, wherein said control section adjusts the timing of irradiating the electron beam on the wafer by synchronizing timing of deactivating the control signal with timing at which said deflecting section is to stop the deflection of the electron beam.

6. The electron beam exposure apparatus as claimed in claim 2, further comprising a temperature detector for detecting temperature of said control section, wherein
   said control section supplies the control signal to said load circuit and synchronizes the timing of activating the control signal with the timing at which said deflecting section is to deflect the electron beam when a temperature change detected by said temperature detector is more than a predetermined value.

7. The electron beam exposure apparatus as claimed in claim 2, wherein said control section supplies the control signal to said load circuit and synchronizes the timing of activating the control signal with the timing at which said deflecting section is to deflect the electron beam in a predetermined time interval.

8. The electron beam exposure apparatus as claimed in claim 2, wherein said control section supplies the control signal to said load circuit and synchronizes the timing of activating the control signal with the timing at which said deflecting section is to deflect the electron beam during startup of said electron beam exposure apparatus.

9. The electron beam exposure apparatus as claimed in claim 1, wherein said control section comprises:
   a driver for activating the control signal; and
   a comparing section connecting with said driver for comparing electric potential of the control signal activated by said driver with predetermined reference electric potential.

10. A calibration method for calibrating an electron beam exposure apparatus including a deflecting section having a deflecting electrode for deflecting an electron beam, and exposing a wafer by the electron beam, the method comprising steps of:
    supplying a control signal for controlling the deflecting section to a load circuit; and
    synchronizing timing of activating the control signal with timing at which the deflecting section is to deflect the electron beam, wherein
    the load circuit has substantially the same impedance as that of the deflecting section, and
    a wire length between the control section, which controls the deflecting section, and the load circuit is shorter than a wire length between the control section and the deflecting electrode.

11. The calibration method for calibrating the electron beam exposure apparatus as claimed in claim 10, further comprising a step of adjusting impedance of the load circuit with that of the deflecting section when at least one of the parts of the deflecting section is replaced.

12. A semiconductor element manufacturing method for exposing a pattern on a wafer by an electron beam, and manufacturing a semiconductor element using an electron beam exposure apparatus including a deflecting section having a deflecting electrode for deflecting the electron beam, the semiconductor element manufacturing method comprising steps of:

supplying a control signal for controlling the deflecting section to a load circuit;

synchronizing timing of activating the control signal with timing at which the deflecting section is to deflect the electron beam by adjusting the timing of activating the control signal; and supplying the control signal, of which the timing of activation is adjusted, to the deflecting section and exposing the wafer, wherein the load circuit has substantially the same impedance as that of the deflecting section, and a wire length between the control section, which controls the deflecting section, and the load circuit is shorter than a wire length between the control section and the deflecting electrode, and the deflecting section switches whether the electron beam is to be deflected or not according to the control signal in said wafer exposing step.

* * * * *